(12) United States Patent
Ruha et al.

(10) Patent No.: US 7,058,463 B1
(45) Date of Patent: Jun. 6, 2006

(54) METHOD AND APPARATUS FOR IMPLEMENTING A CLASS D DRIVER AND SPEAKER SYSTEM

(75) Inventors: Antti Ruha, Oulu (FI); Tarmo Ruotsalainen, Oulu (FI); Jussi-Pekka Tervaluoto, Oulu (FI)

(73) Assignee: Nokia Corporation, Espoo (FI)

( * ) Notice: Subject to any disclaimer, the term of this patent is extended or adjusted under 35 U.S.C. 154(b) by 1073 days.

(21) Appl. No.: 09/794,599

(22) Filed: Feb. 27, 2001

Related U.S. Application Data

(60) Provisional application No. 60/258,735, filed on Dec. 29, 2000.

(51) Int. Cl.
*G06F 17/00* (2006.01)

(52) U.S. Cl. .................. 700/94; 381/111; 341/143; 330/251

(58) Field of Classification Search ............ 330/251, 330/10, 207 A; 341/143; 700/94; 381/120
See application file for complete search history.

(56) References Cited

U.S. PATENT DOCUMENTS

| | | | |
|---|---|---|---|
| 4,515,997 A * | 5/1985 | Stinger, Jr. .................. 381/116 |
| 5,144,308 A | 9/1992 | Norsworthy | |
| 5,592,559 A * | 1/1997 | Takahashi et al. .......... 381/111 |
| 5,745,061 A | 4/1998 | Norsworthy et al. | |
| 5,889,482 A | 3/1999 | Zarubinsky et al. | |
| 5,990,815 A | 11/1999 | Linder et al. | |
| 5,990,819 A | 11/1999 | Fujimori | |
| 6,011,501 A | 1/2000 | Gong et al. | |
| 6,087,969 A | 7/2000 | Stockstad et al. | |
| 6,346,898 B1 * | 2/2002 | Melanson .................. 341/143 |
| 6,414,614 B1 * | 7/2002 | Melanson .................. 341/143 |

FOREIGN PATENT DOCUMENTS

| | | |
|---|---|---|
| DE | 4117607 A1 | 12/1992 |
| EP | 0543224 A2 | 11/1992 |
| EP | 0899884 A2 | 6/1998 |
| EP | 0936837 A2 | 2/1999 |

(Continued)

OTHER PUBLICATIONS

Multibit Σ-Δ A/D Converter Incorporating A Novel Class of Dynamic Element Matching Techniques; Leung, Bosco H et al; IEEE Transactions on Circuits and Systems II Analog and Digital Signal Processing, vol. 39 No. 1; Jan. 1992.

(Continued)

*Primary Examiner*—Vivian Chin
*Assistant Examiner*—Corey Chau
(74) *Attorney, Agent, or Firm*—Harrington & Smith, LLP

(57) ABSTRACT

An audio path is constructed to include a multi-bit sigma-delta converter for converting an N-bit digital input to an n-bit output representing an over-sampled, lower resolution n-bit version of the N-bit digital input; a formatter for converting the n-bit output to an m signal output (e.g., as a thermometer code, a SDM format or a PWM format); an m-by-m switching matric for receiving the m output signals and for reordering the m output signals, m class-D drivers individual ones of which are driven by one of the reordered m output signals for driving one of m speakers; and a dynamic element matching (DEM) block coupled to the switching matric for controlling the reordering of the m output signals driving the m class-D drivers for spreading the distortion due at least to driver-speaker pair mismatch to wide band noise. The DEM may operate to generate white noise, or it may generate shaped (colored) noise.

21 Claims, 3 Drawing Sheets

FOREIGN PATENT DOCUMENTS

WO     WO-96/31086     10/1996
WO     WO 98/44626     10/1998

OTHER PUBLICATIONS

Linearity Enhancement of Multibit ΔΣ A/D and D/A Converters Using Data Weighted Averaging; Baird, Rex T. et al; IEEE Transactions on Circuits and Systems II Analog and Digital Signal Processing, vol. 42 No. 12; Dec. 1995.

A Noise-Shaping Coder Topology for 15+ Bit Converters; Carley, L. Richard; IEEE Journal of Solid-State Circuits, vol. 24, No. 2; Apr. 1989.

* cited by examiner

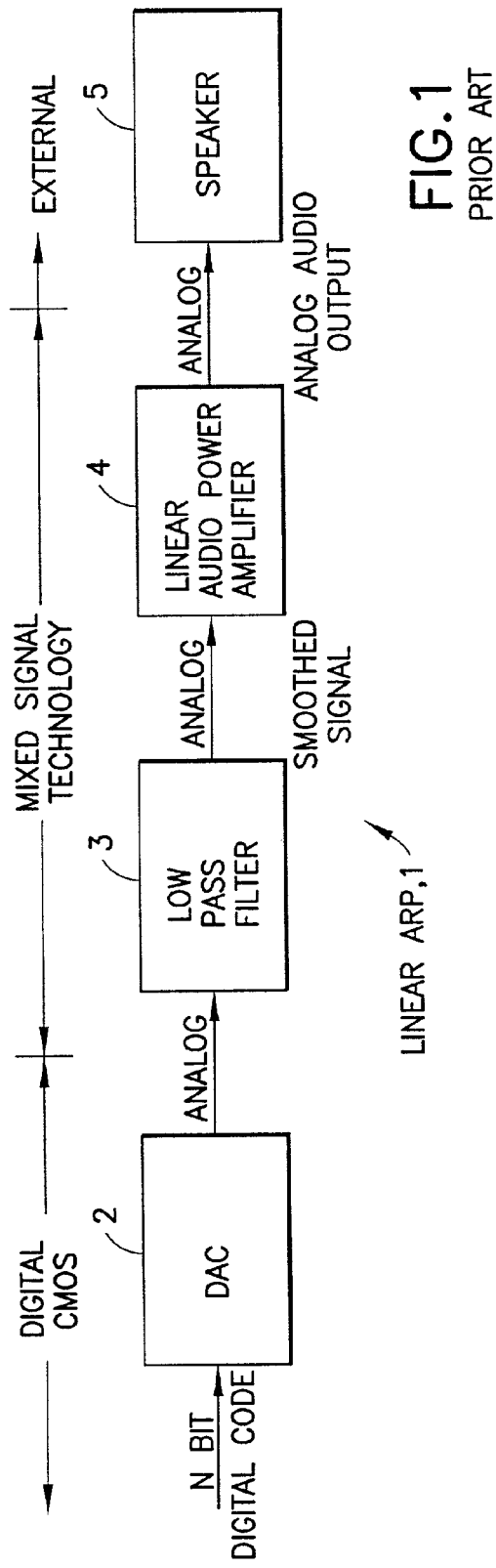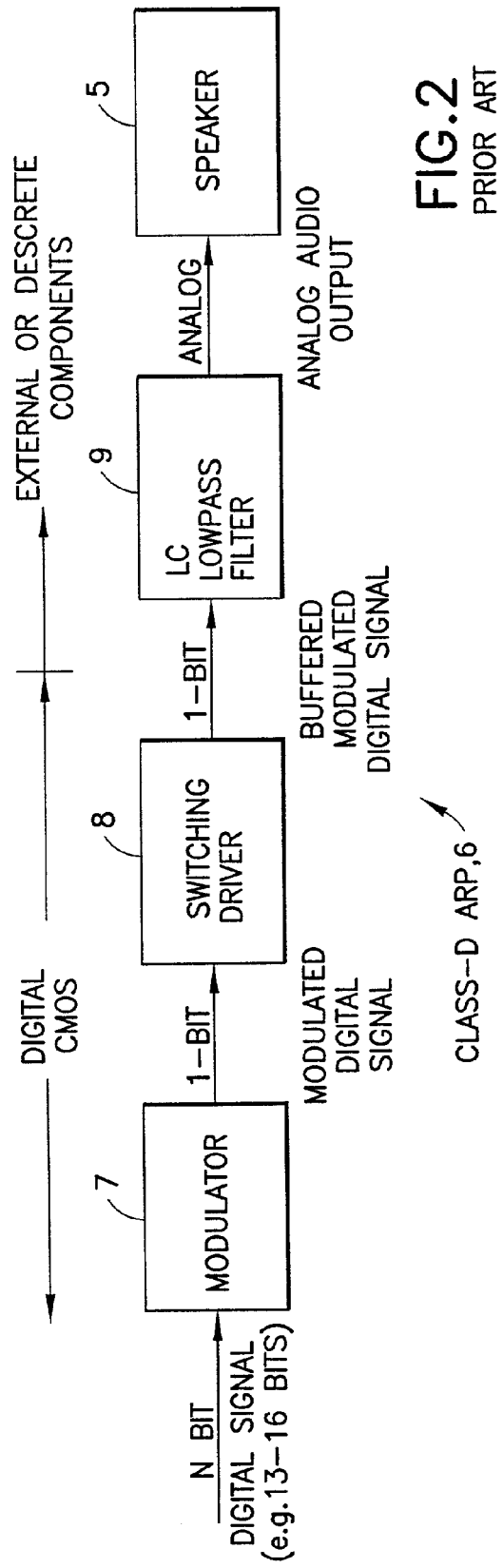

METHOD AND APPARATUS FOR IMPLEMENTING A CLASS D DRIVER AND SPEAKER SYSTEM

CLAIM OF PRIORITY FROM COPENDING PROVISIONAL APPLICATION

This patent application claims priority under 35 U.S.C. §119(e) from Provisional Patent Application No. 60/258,735, filed Dec. 29, 2000, incorporated by reference herein.

FIELD OF THE INVENTION

This invention relates generally to amplifier circuitry and speaker systems and, more specifically, to class D amplifier circuitry having a modulator and a switching power stage driving multiple speaker actuators or elements.

BACKGROUND OF THE INVENTION

Reference is made to FIG. 1 for showing a conventional linear audio reproduction path (ARP) 1. The ARP 1 includes a digital-to-analog converter (DAC) 2 that receives an N-bit digital code representing the digitized audio signal to be reproduced. The analog output signal of the DAC 2 is fed to a lowpass smoothing filter 3, and the smoothed analog signal is then input to a linear audio power amplifier 4 (e.g., class A, B, AB). The output of the linear power amplifier 4 drives an external speaker 5. Single bit sigma-delta techniques (a digital modulator and single bit DAC) to achieve the desired conversion accuracy are typically employed by the DAC 2.

While certain components can be implemented with state-of-the-art integrated circuit fabrication techniques, such as digital CMOS techniques using narrow linewidths and low supply voltages, implementing the DAC stage 2 and linear power amplifier 4 have become increasingly difficult to implement using these processes, while achieving a desired performance level. As such, a mixed-signal process can be used.

While high performance can be achieved with the linear amplifier 4, such as a class A, B or AB amplifier, the power efficiency is below 50% at best, resulting in the generation of excess heat as well as increased battery power consumption.

Class-D amplifiers are well known and widely used. Class-D amplifiers are particularly useful in applications where high efficiency is required, such as in power amplifiers, regulators and similar types of circuitry. The high efficiency of the class D amplifier (e.g., about 90%) makes it particularly attractive for use in battery-powered applications, such as portable radios, tape and CD players, and personal communicators, including wireless devices such as cellular telephones and mobile terminals.

FIG. 2 shows a conventional class-D ARP 6. An input N-bit digital signal (e.g., 13 to 16 bits) is applied to a digital modulator 7 where it is modulated to a one bit pulse width modulated (PWM) or a pulse density modulated (PDM) format. The PWM or PDM signal drives a switching driver 8, such as a conventional H-bridge driver configuration or an inverter, that provides a buffered modulated digital signal to a low pass filter 9. The resulting filtered analog signal is used to drive the external speaker 5.

A significant advantage of the class-D amplifier chain depicted in FIG. 2 is the high efficiency that can be achieved, typically as much as 90%. However, the linearity is degraded by the presence of second order effects, such as noise coupling from the power supply lines and non-ideal H-bridge switching characteristics. The switching and quantization noise spectrum also contains high noise levels at high frequencies, resulting in the need for the external lowpass (LC) filter 9 to avoid unnecessary power transmission and consumption, as well as to reduce undesirable noise radiation (EMC).

The use of the class-D techniques based on the digital modulator 7 provides a number of advantages for mobile wireless terminals. These advantages include an increased integration level, ease of design and testing, and compactness due to the inherent digital to analog conversion. However, a direct class D implementation (no feedback) can only achieve about 50–60 dB SNDR, as it is limited by non-ideal switching characteristics. Also, the tolerance for power supply noise (power supply rejection ratio PSRR) is also low, typically about 0–6 dB.

It is known in the art to employ binary weighted multiple speaker actuators or elements, which could be, for example, coils, or EMF, or piezoelectric-based components. As an example, the use of double coils is known for summing two stereophonic channels into a monophonic channel at low frequencies. A problem with the use of multiple drivers and speaker actuators or elements is that mismatches between the speaker actuators or elements, even as small as 1% to 2%, can result in the generation of objectionable user-perceptible audio distortion.

It is known to use Dynamic Element Matching (DEM) techniques in the context of sigma-delta converters and 1-bit data formats. Reference in this regard can be had to, for example, U.S. Pat. No. 5,990,819, "D/A converter and delta-sigma D/A converter", by Fujimori and to U.S. Pat. No. 6,011,501, "Circuits, systems and methods for processing data in a one-bit format", by Gong et al. Dynamic element matching and sigma-delta modulator techniques are both well known in the art.

OBJECTS AND ADVANTAGES OF THE INVENTION

It is a first object and advantage of this invention to provide an improved audio path circuit and system that overcomes the foregoing and other problems.

It is a further object and advantage of this invention to provide an audio path constructed using multiple class-D drivers and speaker actuators or elements.

It is one further object and advantage of this invention to provide an audio path that includes, in combination, a multi-bit sigma-delta converter for converting an N-bit digital input to an n-bit output representing an over-sampled, lower resolution n-bit output, a formatter for converting the n-bit output to an m signal output, m class-D drivers individual ones of which drive one of m speakers, and a dynamic element matching (DEM) block for controlling the reordering of the m output signals feeding the m class-D drivers in order to spread the distortion due at least to driver-speaker pair mismatch to wide band noise.

SUMMARY OF THE INVENTION

The foregoing and other problems are overcome and the objects and advantages are realized by methods and apparatus in accordance with embodiments of this invention.

The teachings of this invention provide an audio path that uses a multi-bit sigma-delta converter for converting an N-bit digital input to an over-sampled, lower resolution n-bit version thereof, a formatter for providing an m signal output in, for example, a thermometer code, or each in a pulse width modulated (PWM) format, or a sigma-delta modulated (SDM) format. The audio path further includes m class-D drivers and m associated speakers, which could include one or more speaker membranes, actuators (e.g., coils) or speaker elements (e.g., an array of piezoelectric or EMF devices). The audio path employs a dynamic element matching (DEM) technique that operates with a m-by-m switch matrix for reordering the m output signals going to the m class-D drivers in order to spread the distortion due at least to driver-speaker pair mismatch to wide band noise. The DEM technique may operate to randomly re-order the m output signals to generate white noise, or the DEM technique may operate to non-randomly reorder the m output signals for generating shaped or colored noise.

The teachings of this invention thus also provide a method of operating an audio path. The method includes steps of operating a multi-bit sigma-delta converter for converting an N-bit digital input to an n-bit output representing an oversampled, lower resolution n-bit version of the N-bit digital input; converting the n-bit output to an m signal output, driving m speakers with m class-D drivers individual ones of which are driven by one of the m output signals; and reordering the m output signals driving the m class-D drivers for spreading the distortion due at least to driver-speaker pair mismatch to wide band noise. The m output signals may be in or are converted to a thermometer code, or they may be in a SDM format, or a PWM format. The step of reordering includes a step of operating an m-by-m switching matrix, the switching matrix being controlled by an output of the DEM block for spreading the distortion to white noise or shaped noise.

BRIEF DESCRIPTION OF THE DRAWINGS

The above set forth and other features of the invention are made more apparent in the ensuing Detailed Description of the Invention when read in conjunction with the attached Drawings, wherein:

FIG. 1 is simplified block diagram of a conventional audio reproduction path;

FIG. 2 is a simplified block diagram of a conventional class D audio reproduction system;

DETAILED DESCRIPTION OF THE INVENTION

Figure 3:
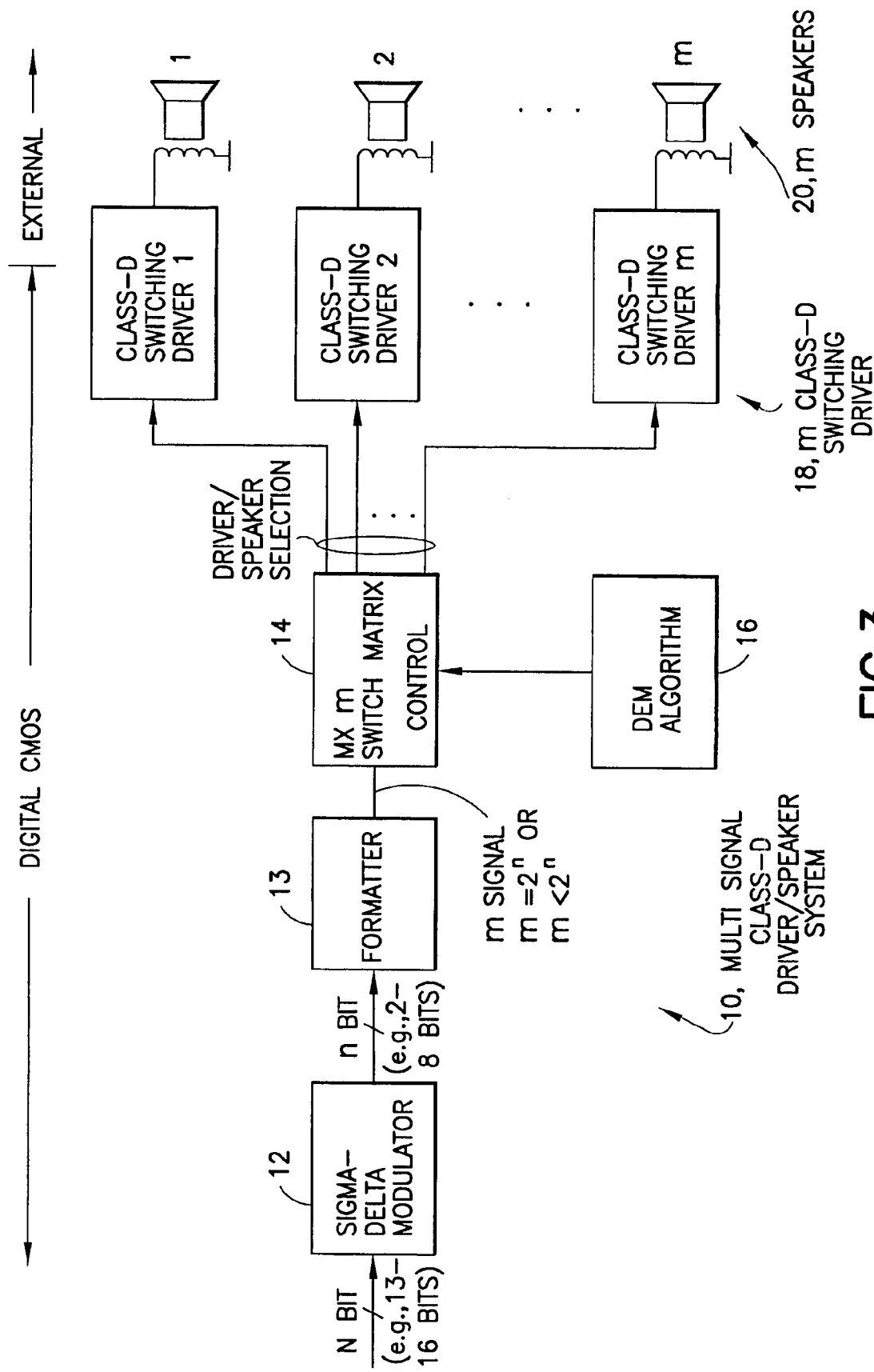
FIG. 3 is a block diagram of a multi-bit class-D driver-speaker system in accordance with the teachings of this invention.

FIG. 3 is a block diagram of a multi-bit class-D driver and speaker system 10 in accordance with the teachings of this invention. The input signal is assumed to be an N-bit digital signal (e.g., 13–16 bits in binary or two's complement or some other suitable format) that is applied to a digital multi-bit sigma-delta modulator (SDM) 12. The sigma-delta modulator 12 converts the high accuracy input signal (e.g., 13–16 bits) to an oversampled lower resolution, but multi-bit (e.g., 2 bit to 8 bit), digital signal format. The known advantages of the sigma-delta modulator are employed to advantage in the input stage, in particular the inherent low quantization noise (e.g., 6 dB/additional bit) and more predictable noise spectra at high frequencies (at least 10 dB to 20 dB lower than that obtained with conventional 1-bit modulators).

The output of the SDM 12 is an n-bit (e.g., 2-bit to 8-bit) signal that is applied to a formatter 13, which provides an m signal output to a m-to-m switch matrix 14. The switch matrix 14 is arranged such that a logic signal appearing on any one of the m inputs can appear on any one of the m outputs. The switch matrix 14 is controlled by an output of a Dynamic Element Matching (DEM) algorithm block 16. Individual one of m signals output from the switch matrix 14 are applied to an associated one of m class-D switching drivers 18, which may be implemented as differential class-D drivers.

All of the components described thus far are suitable for fabrication as a digital CMOS circuit, thereby overcoming certain of the problems referred to above. The output of the switching stage 18 is used to drive an external load, in this case speakers 20.

More particularly, the m buffered digital output signals taken from the class-D switching drivers 18 each drive an associated one of m loads, which in this case are the m speakers 20. The speakers 20 can include speaker actuators, such as coils, or speaker elements, such as piezoelectric or EMF elements. In general, a speaker array may include a plurality of separate speaker membranes each with its own coil, actuator, or element, while a multi-coil or multi-actuator speaker can include a plurality of coils or actuators or elements driving one speaker membrane.

Figure 4:
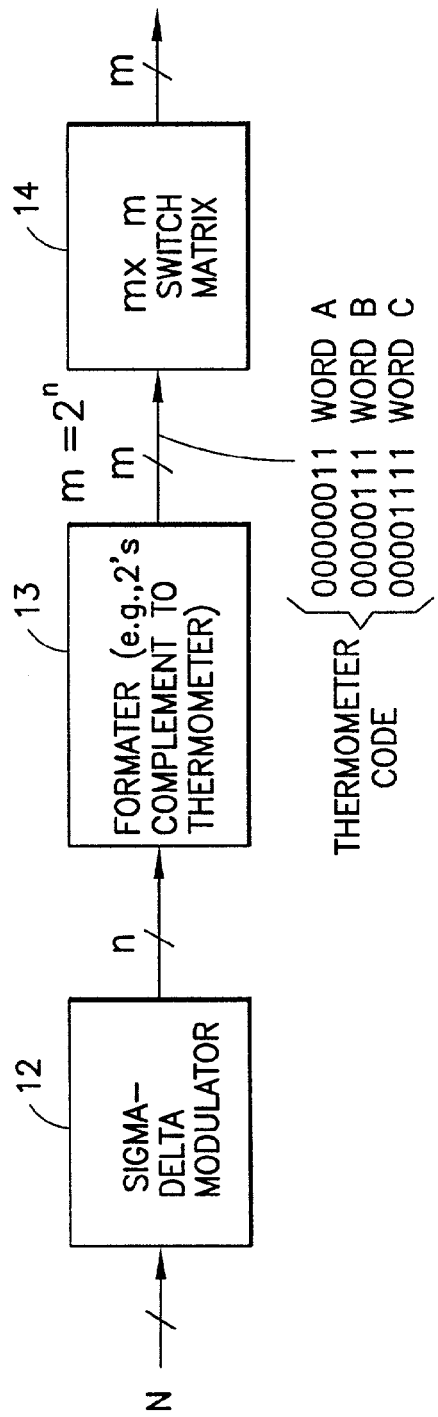
FIG. 4 shows an exemplary 8-bit output of the sigma-delta modulator, where the n-bit output of the sigma-delta modulator is converted by a formatter to, in this example, an m signal thermometer code format.

Referring to FIG. 4, which shows an exemplary 8-bit output of the sigma-delta modulator 12 (i.e., n=8), the output of the sigma-delta modulator 12 is converted by the formatter 13 to m one bit signals that form a thermometer code, wherein $m=2^n$. In the thermometer code format increasing values are indicated by setting additional bits in the output word. In the Figure Word B is larger in magnitude than Word A (by one bit), and Word C is larger in magnitude than Word B (also by one bit). The teachings of this invention are not, however, limited to the use of the thermometer code format, as other formats (e.g., binary and two's complement) may be used as well. For example, the formatter 13 may also be implemented with PWM techniques, where the m signals ($m<2^n$) are each pulse width modulated ($2^n/m$ levels) and represent one of m subranges of the n-bit input signal.

Figure 5:
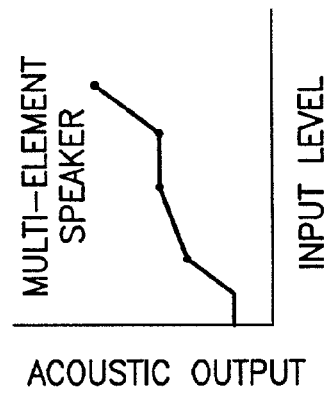
FIG. 5 depicts an exemplary transfer curve of a multi-element speaker with mismatched elements.

The m speakers 20 (array or multi-element or multi-actuator) are ideally at least nominally identical, but in practice are assumed to be randomly mismatched by, for example, 1% to 2%. This mismatch causes harmonic distortion that is proportional to the transfer curve of a multi-element speaker. Note that FIG. 5 shows an exemplary transfer curve of a multi-element speaker with mismatched elements. The function of the DEM algorithm block 16 is to convert this harmonic distortion to either white noise or shaped noise, also referred to as colored noise. For the white noise case, the DEM algorithm block 16 operates the switch matrix 14 on a random selection basis so as to randomly distribute the m signals forming a thermometer code (or, for example, PWM signals) input amongst the m output signals of the switch matrix 14. For the shaped noise case, the DEM algorithm block 16 operates the switch matrix 14 on a non-random selection basis so as to distribute the m signals forming the thermometer code (or, for example, PWM or SDM signals) input amongst the m output signals of the switch matrix 14 such to reduce noise in the signal band. In either case, the DEM algorithm block 16 reorders the m output signals feeding the m class-D drivers 28 for spreading the distortion due at least to driver-speaker pair mismatch to wide band noise. In this way the objectionable audio distortion is converted to white or colored noise, which is less objectionable to the listener. The DEM algorithm block 16 may change the switching state of the m-by-m switch matrix 14 on a per sample basis, or at some lower rate.

Reference with regard to the DEM (dynamic element matching) technique can be had to chapter 8.3.3 of "Delta-Sigma Data Converters", S. Norsworthy, R. Scherier, G. Temes, IEEE Press (1997), incorporated by reference herein.

Figure 6:
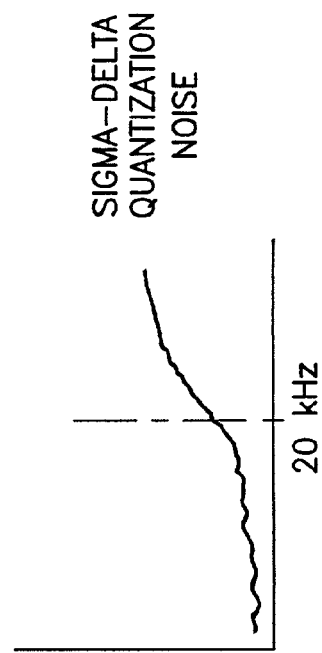
FIG. 6 is a graph depicting the operation of the sigma-delta converter in pushing the quantization noise above the preferred audio band.

The sigma-delta modulator 12 operates so as to push its quantization noise above the audio band of interest. The preferred audio band includes about 300 Hz, for telephone conversations the preferred audio band extends to about 4 kHz, while for full audio fidelity the preferred audio band extends to about 20 kHz. FIG. 6 is a graph depicting the operation of the sigma-delta modulator 12 in pushing the quantization noise above the preferred audio band (in this case 20 kHz). The sigma-delta modulator 12 sample rate is preferably oversampled by more than a factor of 10 compared to the Nyquist rate.

It can be appreciated that these teachings permit the entire audio path, less the speakers 20, to be integrated into one audio path integrated circuit, which may use low power CMOS technology. These teachings further enable the LC smoothing filter 9 to be eliminated in some applications, thereby further reducing cost and circuit complexity.

In general, the formatted signal from the formatter 13 may be in the thermometer code form, or in the sigma-delta modulated (SDM) or the pulse width modulated (PWM) format, although other modulation techniques are also within the scope of these teachings.

While the invention has been particularly shown and described with respect to preferred embodiments thereof, it will be understood by those skilled in the art that changes in form and details may be made therein without departing from the scope and spirit of the invention.

What is claimed is:

1. An audio path, comprising:
   a multi-bit sigma-delta modulator for converting an N-bit digital input to an n-bit output representing an over-sampled, lower resolution n-bit version of the N-bit digital input;
   a formatter for converting the n-bit output to an m signal output;
   m class-D drivers individual ones of which are driven by one of said m output signals for driving one of m speakers; and
   a dynamic element matching (DEM) block for controlling the reordering of the m output signals driving the m class-D drivers for spreading the distortion due at least to driver-speaker pair mismatch to wide band noise.

2. An audio path as in claim 1, wherein said m output signals form a thermometer code format.

3. An audio path as in claim 1, wherein said m output signals are in a pulse width modulated (PWM) format.

4. An audio path as in claim 1, wherein said m output signals are in a sigma-delta modulated (SDM) format.

5. An audio path as in claim 1, wherein $m \leq 2^n$.

6. An audio path as in claim 1, wherein said speakers comprise one or more speaker membranes.

7. An audio path as in claim 1, wherein said speakers comprise speaker coils.

8. An audio path as in claim 1, wherein said speakers comprise an array of speakers.

9. An audio path as in claim 1, wherein said speakers comprise one of piezoelectric or EMF speaker elements.

10. An audio path as in claim 1, wherein said class-D drivers are comprised of differential class-D drivers.

11. An audio path as in claim 1, and further comprising an m-by-m switching matrix interposed between said m output signal of said formatter and said m class-D drivers, said switching matrix being controlled by an output of said DEM block.

12. A method of operating an audio path, comprising steps of:
   operating a multi-bit sigma-delta converter for converting an N-bit digital input to an n-bit output representing an over-sampled, lower resolution n-bit version of the N-bit digital input;
   converting said n-bit output to an m signal output;
   driving m speakers with m class-D drivers individual ones of which are driven by one of said m output signals; and
   reordering the m output signals driving the m class-D drivers for spreading the distortion due at least to driver-speaker pair mismatch to wide band noise.

13. A method as in claim 12, wherein said m output signals form a thermometer code.

14. A method as in claim 12, wherein said m output signals are in a pulse width modulated (PWM) format.

15. A method as in claim 12, wherein said m output signals are in a sigma-delta modulated (SDM) format.

16. A method as in claim 12, wherein $m \leq 2^n$.

17. A method as in claim 12, wherein said speakers comprise at least one speaker membrane.

18. A method as in claim 12, wherein the step of reordering comprises a step of operating an m-by-m switching matrix, said switching matrix being controlled by an output of a Dynamic Element Matching (DEM) block for spreading the distortion to white noise or shaped noise.

19. An audio path, comprising:
   a multi-bit sigma-delta modulator for converting an N-bit digital input to an n-bit output representing an over-sampled, lower resolution n-bit version of the N-bit digital input;
   a formatter for converting said n-bit output to an m signal output;
   an m-by-m switching matrix for receiving said m output signals and for reordering the m output signals;
   m class-D drivers individual ones of which are driven by one of said reordered m output signals for driving one of m speakers; and
   a dynamic element matching (DEM) block coupled to said switching matrix for controlling the reordering of the m output signals driving the m class-D drivers for spreading the distortion due at least to driver-speaker pair mismatch to wide band noise comprised of one of white noise or shaped noise.

20. An audio path as in claim 19, wherein $m \leq 2^n$.

21. An audio path as in claim 19, wherein said audio path, less the speakers, is integrated into one audio path integrated circuit.

* * * * *